United States Patent [19]

Shida

[11] 4,363,962
[45] Dec. 14, 1982

[54] FOCUSSING APPARATUS WITH PLURAL EMITTER-DETECTOR PAIRS

[75] Inventor: Takao Shida, Yokohama, Japan
[73] Assignee: Fujitsu Limited, Kawasaki, Japan
[21] Appl. No.: 219,495
[22] Filed: Dec. 23, 1980

[30] Foreign Application Priority Data

Dec. 27, 1979 [JP] Japan .................... 54-169182

[51] Int. Cl.$^3$ ............................................. G01B 11/06
[52] U.S. Cl. ................................... 250/201; 250/548
[58] Field of Search ............ 250/201, 204, 548, 557; 356/375, 381, 445

[56] References Cited

U.S. PATENT DOCUMENTS 3,645,623  2/1972  Patten ........................... 356/381 X

*Primary Examiner*—David C. Nelms
*Assistant Examiner*—Darwin R. Hostetter
*Attorney, Agent, or Firm*—Staas & Halsey

[57] ABSTRACT

An optical focussing apparatus, preferably used in the manufacture of integrated semiconductor circuits which automatically positions the focal point of a lens on an object to be focussed on. The focussing apparatus is comprised of a plurality of optical sets distributed around the object, each of which sets is comprised of a photo emitter for projecting a light beam onto the object and an oppositely disposed photo detector for receiving the light beam reflected from the object. Means are provided to adjust the relative distance between the object and the focal point of the lens in response to the average intensity level of the reflected light beams.

4 Claims, 6 Drawing Figures

FOCUSSING APPARATUS WITH PLURAL EMITTER-DETECTOR PAIRS

BACKGROUND OF THE INVENTION

The present invention relates to a focussing apparatus, and more particularly relates to an optical focussing apparatus, preferably used in a process for manufacturing integrated semiconductor circuits.

Generally, in the manufacturing process of integrated semiconductor circuits (IC), an optical processing apparatus is required to fabricate very fine and precise circuits or logic patterns of an IC. Such an optical processing apparatus is necessary for performing an exposure of patterns through a reticle to be used as a so-called mask as well as for performing an exposure of patterns on a photoresist film coated on a wafer.

Every time such optical processing apparatus is utilized, it is always necessary to conduct an operation for correctly positioning the focal point of a lens on an object to be focussed on so as to obtain a sharp IC pattern image. This is because, an optical processing apparatus provides a desired function with the aid of an optical lens. It should be noted that the present invention specifically refers to an apparatus which carries out the above mentioned operation for determining a correct focal point.

In the prior art, as will be explained in detail hereinafter, such focussing apparatus is set up in such a manner that a light beam is illuminated, in one direction, onto a certain portion of a wafer to be focussed on. The light beam is then reflected, in the same direction, from said certain portion and is received by a photo detector. Whether or not the focal point of the lens is properly focussed on said certain portion, can be determined by the photo detector from the intensity level of the reflected light beam. However, a problem has arisen in that the intensity level varies not only by the locational variation of said certain portion to be focussed on, but also by a variation of the condition of the surface thereof. Accordingly, an accurate focussing operation can not be obtained due to said variation of the condition of the surface of said certain portion to be focussed on. The above mentioned problem is very likely to arise, when, for example, a wafer to be focussed on has, on its surface, particular uniform patterns parallely extending in the same direction. The uniform patterns result from the usual etching employed process during the IC manufacturing step.

SUMMARY OF THE INVENTION

Therefore, it is an object of the present invention to provide a focussing apparatus which compensates for variations in the condition of the surface of the object to be focussed on, to determine the correct focal point.

BRIEF DESCRIPTION OF THE DRAWINGS

The above mentioned object can be achieved by a focussing apparatus according to the present invention utilizing a plurality of optical sets distributed around the object to be focussed on, wherein each set is comprised of a photo emitter and a photo detector disposed directly opposite each other around the object.

The present invention will be more apparent from the ensuing descriptions with reference to the accompanying drawings wherein.

DETAILED DESCRIPTION OF THE PREFERRED EMBODIMENTS OF THE INVENTION

Figure 1:
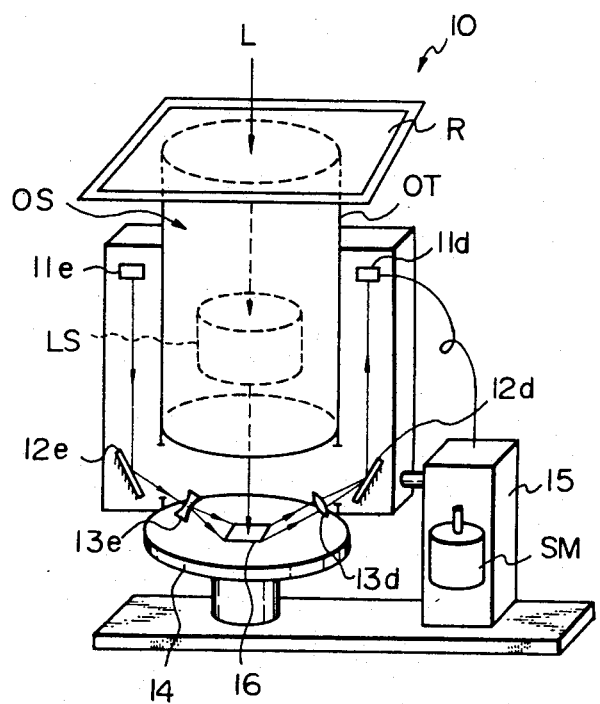
FIG. 1 is a pictorial perspective view of a part of an IC manufacturing system, including a focussing apparatus of the prior art therein.

As shown in FIG. 1, the IC manufacturing system 10 includes therein a prior art focussing apparatus comprised of a single optical set which includes a photo emitter 11e, such as a light emitting diode producing an infrared ray light, and a photo detector 11d, such as a photo diode which is sensitive only to an infrared ray light. The photo emitter 11e produces a light beam to be illuminated onto an object 16 to be focussed on, via a mirror 12e and a light expanding lens 13e. The object 16 is specifically a part of a wafer 14 for fabricating the ICs. In order to form the desired circuit and logic patterns on the object 16 a photoresist film (not shown), which is sensitive only to an ultraviolet ray light is coated on the object 16. The desired IC image is created by means of a reticle R and an optical system OS having a lens LS and an optical tube OT. A light source (not shown) provides a strong light L, such as an ultraviolet ray light toward said photoresist via the reticle R and the lens LS, so that a desired IC image, defined by the reticle R, can be exposed on the photoresist of the object 16. In order to obtain a fine and precise IC image on the object 16, the focal point of the lens LS must correctly be determined on the object 16. In order to achieve this, a means 15 is employed in the system 10, for positioning the correct focal point of the lens precisely on the object 16. The expanded light beam from the lens 13e is reflected by the object, and the reflected light beam is applied to a photo detector 11d, via a converging lens 13d and a mirror 12d. The output of the photo detector 11d is applied to the means 15 so as to drive a computer controlled servo-motor SM. The servo-motor SM can adjust the relative location between the focal point of the lens LS and the object 16.

Figure 2:
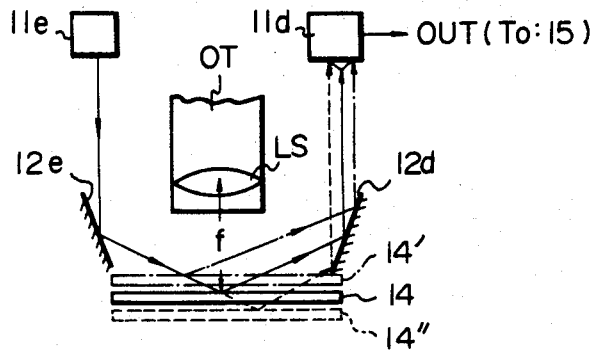
FIG. 2 is a schematic partial front view of the system 10 shown in FIG. 1, used for explaining an operational principle of a focussing apparatus.

The operational principle of the focussing apparatus can be understood with reference to FIG. 2, which is a schematic partial front view of the system 10 shown in FIG. 1. In FIG. 2, members which are represented by the same reference numerals and symbols as those of FIG. 1, are identical to each other. First, the object on the wafer 14, illustrated by a solid line, is initially located at a position corresponding to a shown distance f which is the same as the focal distance of the lens LS. Such correct focal point can be determined by manual operation through some trail exposures until a very fine and precise IC image can be obtained. At this time, the light beam, projected from the light emitter 11e, travels to the light detector 11d along a path indicated by solid line arrows. Therefore, the detector 11d produces an output having a maximum intensity level.

The above mentioned initial adjustment for positioning the correct focal point, is achieved with respect to one of the chips to be formed on the wafer 14 (FIG. 1).

However it is not guaranteed that the remaining chips will be positioned at the correct focal point, every time each chip is transferred and located right beneath the lens LS. This is because, usually, the wafer 14 (FIG. 1) has, on its surface, very small undulations on the order of about 1 μm in depth after some etching processes. Accordingly, some chips may be located slightly above the level of the reference level (14), such as shown by the chain-dotted line 14'. Alternately, some objects may be located slightly under the level of the reference level (14), as is shown by the broken line 14". In such cases, the photo detector 11d does not produce the output having a maximum intensity level, as will be understood from paths indicated by broken line arrows and chain-dotted line arrows, and the respective reflected light beams are not illuminated onto the center of the photo detector 11d. Consequently, the detector 11d produces an output having a relatively low intensity level. Then the means 15 of FIG. 1 adjusts the relative distance between the focal point and the object 16 until an output having the maximum intensity level is obtained so as to move the object 16 to the level where the reference level (14) is located.

Figure 3A:
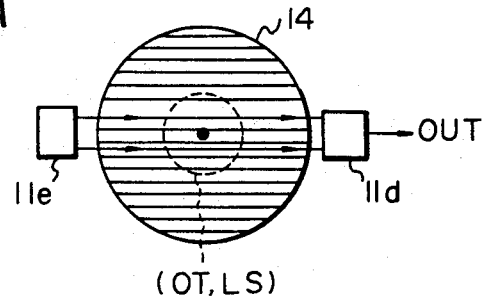
FIGS. 3A and 3B are plan views of objects to be focussed on having particular patterns thereon.
Figure 3B:
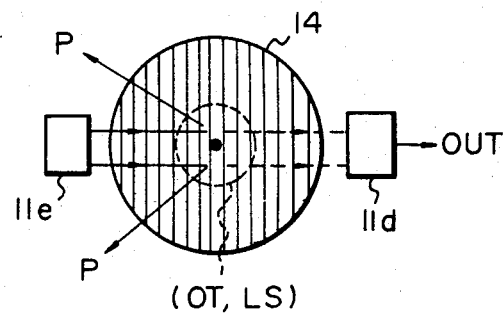

The above mentioned operational principle is effectively realized, if each chip has the proper surface conditions. However, it should be noted that each chip does not always have the proper surface conditions. If the system 10 (FIG. 1) deals with an object 16 having a particular pattern extending parrallelly in the same driection, the above mentioned proper surface conditions cannot always be expected. An object 16, having such particular pattern, is often introduced in the system 10. For example, such pattern is formed on a wafer to be fabricated as a so-called masterslice semiconductor device. As is known, in the masterslice semiconductor device, a great number of basic logics and conductors are preformed uniformly on the wafer. Especially, such great number of basic conductors prevent one from putting the above mentioned operational principle into practical use. It is often impossible to perform focussing operation with a high degree of accuracy, when such a masterslice semiconductor device is processed in the system 10 (FIG. 1). The reason for this will be clarified with reference to FIGS. 3A and 3B. FIGS. 3A and 3B are plan views of objects having particular patterns thereon. In these figures, the members 11e, 11d, 14, OT and LS have already been explained. The black dot indicates the center of the object 16 (FIG. 1). When the particular pattern, extending parallelly in the same direction, is arranged with a layout as shown in FIG. 3A, the light beams, indicated by arrows, travel from the photo emitter 11e to the photo detector 11d without trouble. Contrary to this, when the particular pattern is arranged with a layout as shown in FIG. 3B, the light beams projected from the photo emitter 11e cannot travel toward the photo detector 11d without trouble. That is, since each of the straight lines of the particular pattern is formed as a mountain chain-shape, the height of which is on the order of several μms, the light beams P are reflected by the slope of the mountain chain and the intensity level of the output (OUT) is considerably reduced. In this case, although the correct focal point is focussed on the object, the means 15 (FIG. 1) determines that the focussing operation must still be continued. As a result, an accurate and precise focussing function is not achieved. If an operator adjusts the object so as to coincide the straight lines of the particular pattern with the paths of the light beams, as shown in FIG. 3A, every time the wafer, having such a particular pattern, is introduced into the system, it will be possible to always conduct an accurate and precise focussing operation. However, such operation by the operator, as mentioned above, is not practical from an economical point of view in a mass-production system.

The focussing apparatus according to the present invention allows the operator to carry out the focussing operation without taking the alignment, between the above mentioned mountain chain and the path of the light beam, into account. According to the focussing apparatus of the present invention, a plurality of optical sets are distributed around the object, wherein each of the optical sets is comprised of both one photo emitter and the corresponding photo detector and both are located symmetrically with respect to the object. Accordingly, the means 15 of FIG. 1 can receive outputs from a plurality of photo detectors simultaneously. Thus, the means 15 can monitor the average intensity level of a plurality of reflected light beams and undesired light beams P of FIG. 3B can be disregarded.

Figure 4A:
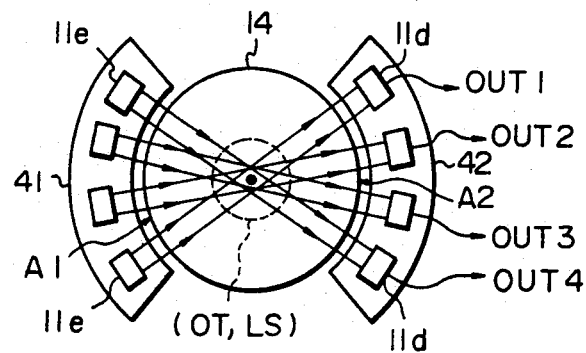
FIG. 4A is a plan view of a first embodiment according to the present invention.

A first embodiment of the focussing apparatus according to the present invention is depicted as a plan view, in FIG. 4A. A second embodiment thereof is in FIG. 4B. In both figures, the members 11e, 11d, 14, OT and LS have already been explained. It should be understood that the mirrors (12e, 12d) and lenses (13e, 13d), shown in FIG. 1, are not illustrated in FIGS. 4A and 4B, because these members are not essential members of the present invention. In FIG. 4A, a photo emitter group 41 is arranged along one half arc A1 of a circular area. The center of the object area coincides with the center of said circular area. At the same time, a photo detector group 42 is arranged along opposite half arc A2 of said circular area. The photo emitter group 41 includes therein a plurality of photo emitters 11e. The photo detector group 42 includes therein a plurality of photo detectors 11d. The photo emitters are distributed one by one along the arc A1. The photo detectors are also distributed one by one along the arc A2. Each of the photo emitters 11e and the corresponding photo detectors 11d are arranged symmetrically with respect to the center of the object 16. The photo detectors 11d, when there exists four photo detectors, produce respective outputs OUT1 through OUT4 indicating respective intensity levels of the reflected light beam.

Figure 4B:
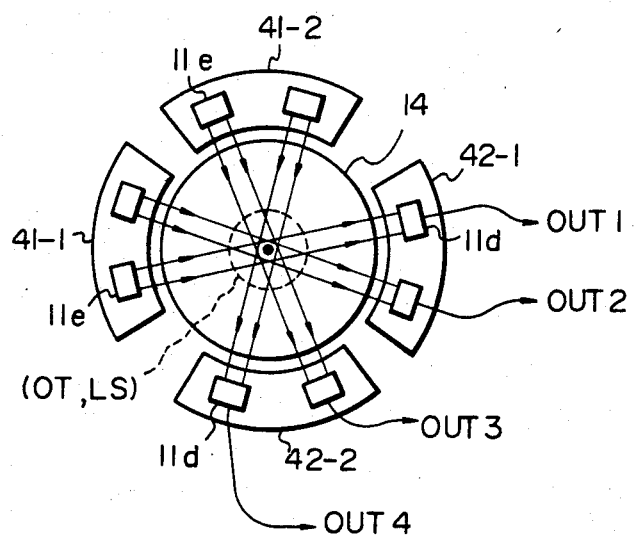
FIG. 4B is a plan view of a second embodiment according to the present invention.

In FIG. 4B, the photo emitter group 41 of FIG. 4A is divided into a plurality of small photo emitter groups 41-1 and 41-2. Similarly, the photo detector group 42 of FIG. 4A is divided into a plurality of small photo detector groups 42-1 and 42-2. The number, by which each of the groups 41 and 42 is divided, is not limited to two, but can be more than two.

As mentioned above, the focussing apparatus of the present invention can always achieve the focussing operation with a high degree of accuracy, regardless of the surface condition of the wafer to be focussed on.

What is claimed is:

1. In a focussing apparatus comprising a photo emitter for projecting a light beam onto an object to be focussed on; a photo detector for receiving the light beam reflected from the object; an optical system having a lens for focussing a pattern on the object; and a means for correctly positioning the focal point of the lens on the object by adjusting the relative distance between the object and the focal point in response to the intensity level of the reflected light beam detected by the photo detector, the improvement which comprises a plurality of optical sets distributed around the object, each of which sets is comprised of a photo emitter and a corresponding oppositely disposed photo detector, both located symmetrically with respect to the object, and are distributed around the object.

2. An apparatus as set forth in claim 1, wherein said photo emitters are arranged side-by-side in a group along one half arc of a circular area, at the center of which circular area the object is located, and said photo detectors are arranged side-by-side in a group along the opposite half arc of the circular area.

3. An apparatus as set forth in claim 2, wherein the photo emitter group is divided into a plurality of small emitter groups and the photo detector group is divided into a plurality of small detector groups, each of the small detector groups and the corresponding small photo emitter groups being located symmetrically with respect to the object.

4. An apparatus as set forth in claim 1, 2 or 3, wherein an average intensity level detected by all the photo detectors, is applied to the means for positioning the focal point on the object.

* * * * *